(12) United States Patent
Sander (10) Patent No.: US 8,223,909 B2
(45) Date of Patent: Jul. 17, 2012

(54) DIGITAL SAMPLING APPARATUSES AND METHODS

(75) Inventor: Wendell B. Sander, Los Gatos, CA (US)

(73) Assignee: Panasonic Corporation, Osaka (JP)

( * ) Notice: Subject to any disclaimer, the term of this patent is extended or adjusted under 35 U.S.C. 154(b) by 1046 days.

(21) Appl. No.: 12/132,926

(22) Filed: Jun. 4, 2008

(65) Prior Publication Data

US 2008/0310568 A1    Dec. 18, 2008

Related U.S. Application Data

(60) Provisional application No. 60/934,819, filed on Jun. 15, 2007.

(51) Int. Cl.
*H04L 7/00* (2006.01)
(52) U.S. Cl. ........................................ 375/355
(58) Field of Classification Search .............. 375/354, 375/355, 356, 371, 374, 376; 327/148, 149, 327/231, 273
See application file for complete search history.

(56) References Cited

U.S. PATENT DOCUMENTS

| | | | | |
|---|---|---|---|---|
| 4,672,639 A | * | 6/1987 | Tanabe et al. | 375/371 |
| 4,821,296 A | * | 4/1989 | Cordell | 375/374 |
| 5,257,025 A | * | 10/1993 | LeCroy, Jr. | 341/100 |
| 5,440,592 A | * | 8/1995 | Ellis et al. | 375/354 |
| 5,563,535 A | | 10/1996 | Corry et al. | |
| 6,094,101 A | | 7/2000 | Sander et al. | |
| 6,219,394 B1 | | 4/2001 | Sander | |
| 6,269,135 B1 | | 7/2001 | Sander | |
| 2002/0085657 A1 | * | 7/2002 | Boerstler | 375/373 |
| 2003/0091137 A1 | * | 5/2003 | Vallet et al. | 375/360 |
| 2003/0214335 A1 | * | 11/2003 | Saeki | 327/165 |
| 2006/0109942 A1 | * | 5/2006 | Vallet | 375/355 |
| 2006/0267635 A1 | * | 11/2006 | Metz et al. | 327/2 |
| 2007/0047686 A1 | * | 3/2007 | Aoki et al. | 375/374 |
| 2008/0180086 A1 | * | 7/2008 | Kwak | 324/76.54 |

OTHER PUBLICATIONS

Sander, W.B. et al., Polar Modulator for Multi-Mode Cell Phones, Custom Integrated Circuits Conference, 2003, Proceedings of the IEEE 2003, Sep. 21-24, 2003, pp. 439-445.

* cited by examiner

*Primary Examiner* — David C. Payne
*Assistant Examiner* — Syed Haider (57) ABSTRACT

Methods and apparatus for sampling and determining the frequency of periodic digital signals. An exemplary digital sampling apparatus includes a polyphase sampling apparatus configured to sample a periodic digital signal according to a polyphase clock system having multiple phases. The multiple phases provided by the polyphase clock system are successively distributed in time so that consecutive phases have a periodic phase difference. By using a polyphase clock system, a sampling rate that is equivalent to a sampling clock having a period equal to the phase difference in time between phases of the polyphase clocks is realized. Accordingly, the effective sampling rate of a given periodic digital signal can be increased, or the sampling of higher frequency periodic digitals signals can be achieved, while the underlying logic circuitry used to capture the samples is clocked at a much lower rate.

12 Claims, 13 Drawing Sheets

DIGITAL SAMPLING APPARATUSES AND METHODS

CROSS-REFERENCE TO RELATED APPLICATIONS

This patent application claims the benefit of U.S. Provisional Patent Application No. 60/934,819, filed on Jun. 15, 2007, the disclosure of which is hereby incorporated by reference.

FIELD OF THE INVENTION

The present invention relates to digital sampling apparatuses and methods, including those used to determine frequencies of periodic digital signals.

BACKGROUND OF THE INVENTION

Determining the frequency of a periodic electrical signal is a common task performed in electronic systems. In the field of radio communications, for example, it is often necessary to determine the frequency of a communication signal in real-time.

Traditionally, analog circuitry has been used to determine the frequency of electrical signals. However, due to the complexity and unreliability of analog circuitry, and the trend toward all-digital radio systems, various digital frequency determining implementations have been proposed. U.S. Pat. No. 6,219,394 ('the '394 patent') discloses, for example, a frequency-to-digital converter (FDC) that operates to digitally determine the instantaneous frequency of a periodic digital signal.

Figure 1:
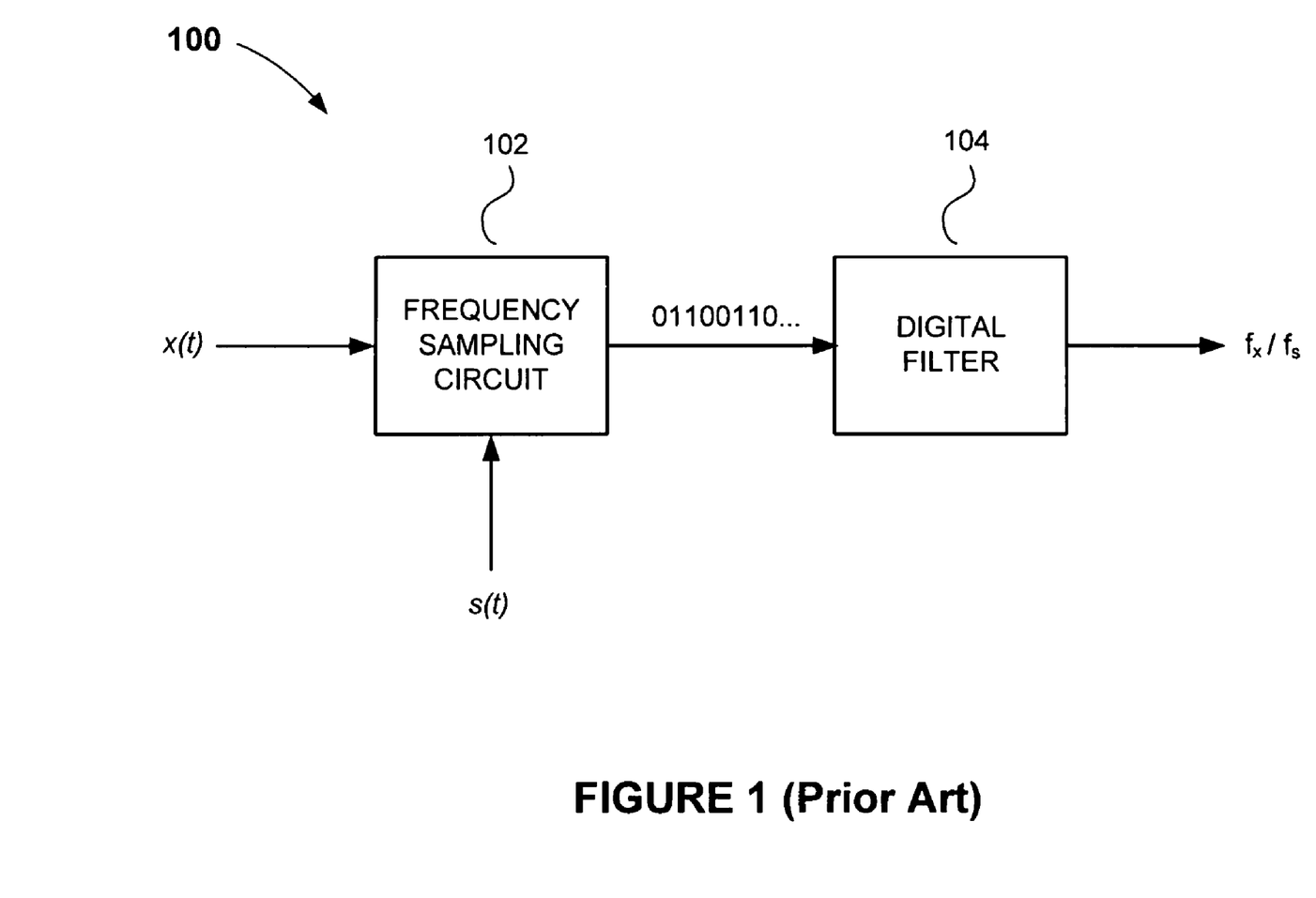
FIG. 1 is a simplified block diagram of a prior art frequency to digital converter (FDC)

FIG. 1 illustrates the two primary components of an FDC 100, similar to that which is disclosed in the '394 patent. As shown, the FDC 100 comprises a frequency sampling circuit 102 and a digital filter 104. The frequency sampling circuit 102 is configured to receive an input signal x(t) (or 'test' signal) having a frequency $f_x$ that is to be determined by the FDC 100. The sampling circuit 102 samples the input signal x(t) at a known sampling rate $f_S$ provided by a sampling clock s(t), and generates a stream of digital bits representing the ratio of $f_x$ to $f_S$. The digital filter 104 is configured to receive the stream of digital bits, and, based on the pattern of logic '1s' and '0s' in the stream, operates to recover the ratio of $f_x$ to $f_S$. Since the sampling clock frequency $f_S$ is a known value, the frequency $f_x$ of the input signal x(t) can be determined from the recovered frequency ratio.

While the FDC 100 in FIG. 1 is desirable in that it provides an all-digital solution, the logic gates used to implement the FDC have inherent limits on the speed at which they may operate. Consequently, the FDC 100 is not suitable for determining frequencies of very high frequency signals. There is a need, therefore, for digital circuits and methods that are capable of sampling and determining frequencies of high-frequency digital signals, and which are not limited by inherent speed constraints of the underlying digital circuitry used to perform the sampling.

SUMMARY OF THE INVENTION

Methods and apparatus for sampling and determining the frequency of periodic digital signals are disclosed. An exemplary digital sampling apparatus includes a polyphase sampling apparatus having a plurality of sampling circuits and a plurality of logic level change circuits. The plurality of sampling circuits is configured to sample a periodic digital signal according to a polyphase clock system having multiple phases. The plurality of logic level change circuits is coupled to the plurality of sampling circuits, and is operable to detect logic level changes of the periodic digital signal that occur between phases of the polyphase clocks. The detected logic level changes can be used to determine the frequency of the periodic digital signal.

According to one aspect of the invention, the multiple phases provided by the polyphase clock system are successively distributed in time so that consecutive phases have a periodic phase difference. According to one embodiment of the invention, the periodic phase different between each pair of consecutive phases is the same. In another embodiment, a periodic phase difference between a first pair of consecutive phases is different from one or more other pairs of consecutive phases of the polyphase clock system.

By using the polyphase sampling apparatuses and methods of the present invention, a sampling rate equivalent to a sampling clock having a period equal to the phase difference in time between phases of the polyphase clocks is realized. Accordingly, the effective sampling rate of a given periodic digital signal can be increased, or the sampling of higher frequency periodic digitals signals is possible, while the underlying logic circuitry used to capture the samples is clocked at a much lower rate.

Other features and advantages of the present invention will be understood upon reading and understanding the detailed description of the preferred exemplary embodiments, found hereinbelow, in conjunction with reference to the drawings, a brief description of which is provided below.

DETAILED DESCRIPTION

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Figure 2A:
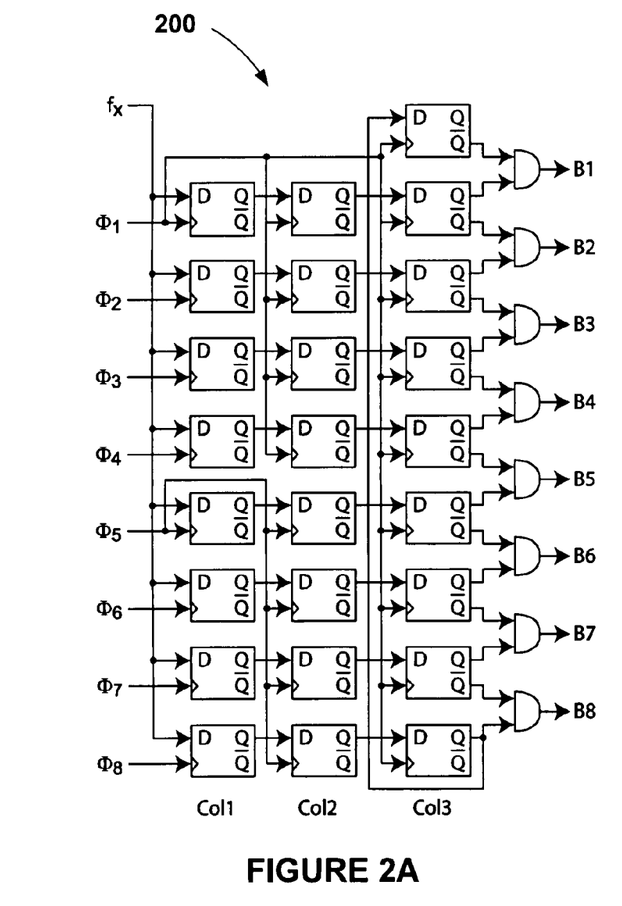
FIG. 2A is a schematic diagram of a polyphase FDC, according to an embodiment of the present invention.

Referring first to FIG. 2A, there is shown a polyphase frequency to digital converter (FDC) 200, according to an embodiment of the present invention. The polyphase FDC 200 comprises a plurality of delay flip-flops (i.e., 'D' flip-flops) configured in an array of rows (eight in this example) and columns (three in this example). The clock inputs of each of the flip-flops in the first column (labeled "Col1" in the drawing) of the flip-flop array are configured to receive clock signals from a polyphase clock system comprised of a plurality of clock signals (eight in this example) $\Phi_1, \Phi_2, \ldots, \Phi_8$. Those of ordinary skill in the art will appreciate and understand that the FDC 200 shown in FIG. 2A is an exemplary embodiment, and that the number of clock signals making up the polyphase clock system can be more or less than eight.

Each clock signal of the polyphase clock system has the same frequency, but each clock signal is successively offset from a clock signal that precedes it by a predetermined fixed phase delay. The data ('D') inputs of each of the flip-flops in the first column (Col1) of the flip-flop array are configured to receive an input signal (referred to herein as a 'test' signal) having a frequency $f_x$ that is to be determined by the FDC 200.

The test signal is labeled in the drawings using the signal's frequency symbol '$f_x$,' and is sometimes referred to as "the test signal $f_x$" in the description that follows, for the sake of convenience and to emphasize that the test signal has that frequency. Some other signals are labeled in a similar manner for similar reasons.

Figure 2B:
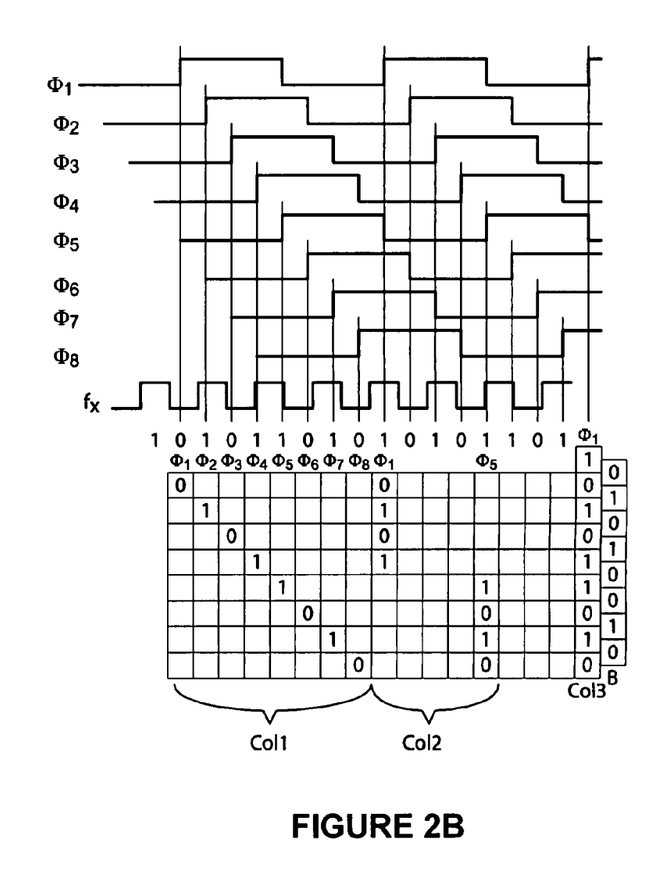
FIG. 2B is a drawing including a timing chart showing the timing relationship among the polyphase clocks $\Phi_1, \Phi_2, \ldots, \Phi_8$ and a test signal applied to the polyphase FDC in FIG. 2A, and an edge detection chart showing edge detection results from sampling the test signal using the polyphase clocks $\Phi_1, \Phi_2, \ldots, \Phi_8$.

The data inputs of the flip-flops in the second column (Col2) of the flip-flop array are coupled to the data outputs of the flip-flops in the first column of the array. The upper four flip-flops in the second column of the array are configured to receive the first clock signal $\Phi_1$ of the plurality of clock signals $\Phi_1, \Phi_2, \ldots, \Phi_8$ at their clock inputs. The lower four flip-flops in the second column are configured to receive the fifth clock signal $\Phi_5$ at their clock inputs. As can be seen in FIG. 2B, the fifth clock signal $\Phi_5$ is 180 degrees out of phase with the first clock signal $\Phi_1$. This allows the FDC 200 to sample the test signal in a circular fashion (i.e., according to the following repeating sampling sequence: $\Phi_1, \Phi_2, \ldots, \Phi_8, \Phi_1, \Phi_2, \ldots, \Phi_8, \ldots, \Phi_1 \ldots$).

The data inputs of the lower eight flip-flops in the third column (Col3) of the flip-flop array are coupled to the data outputs of the flip-flops in the second column of the array. An additional flip-flop at the top of the third column (i.e., the uppermost flip-flop in the third column) has a data input that is coupled to the data output of the lowermost flip-flop in the third column of the array. The lower eight flip-flops in the third column of the array are configured to receive the first clock signal $\Phi_1$ at their clock inputs. The uppermost flip-flop in the third column of the array is also configured to receive the first clock signal $\Phi_1$ at its clock input. Finally, the complementary outputs (i.e. the Q and $\overline{Q}$ outputs) of the flip-flops in the third column of the flip-flop array are coupled to inputs of a plurality of AND logic gates, which provide digital outputs B1-B8.

FIG. 2B includes a timing diagram and a sampling chart, which can be referred to, to better understand the operation of the polyphase FDC 200 in FIG. 2A. The test signal (indicated by the label '$f_x$' in the timing diagram) is successively sampled by the plurality of clocks $\Phi_1, \Phi_2, \ldots, \Phi_8$ of the polyphase clock system. The samples are captured by the flip-flops in the first column of the array. On the next positive edge of the first clock signal $\Phi_1$, the samples captured by the upper four flip-flops of the first column of the array are clocked into the upper four flip-flops of the second column of the array. Similarly, on the next positive edge of the fifth clock signal $\Phi_5$, the samples captured by the lower four flip-flops of the first column of the array are clocked into the lower four flip-flops of the second column of the array. On the next positive edge of the first clock signal $\Phi_1$, the data samples held by the flip-flops in the second column of the array are clocked into the lower eight flip-flops in the third column of the array. The data sample that was clocked into the lowermost flip-flop is then clocked into the uppermost flip-flop in the third column of the array by the first clock signal $\Phi_1$, thereby forming a circular like sampling cycle.

The successive samples appearing at the outputs of the flip-flops in the third column of the flip-flop array are logically combined by the AND logic gates to provide an indication as to whether level changes of $f_x$, from a logic '0' to a logic '1' have occurred between the phases of the plurality of clocks $\Phi_1, \Phi_2, \ldots, \Phi_8$. For example, when successive samples of the test signal by the first and second clock signals $\Phi_1$ and $\Phi_2$ are a logic '0' and a logic '1,' the output of the AND logic gate having an output labeled "B2" will provide a logic '1' value, to indicate that a logic level change from a logic '0' to a logic '1' has occurred between rising edges of the first and second clock signals $\Phi_1$ and $\Phi_2$. The detected low-to-high logic level changes are indicative of positive edge transitions in the test signal. Accordingly, by detecting and monitoring the logic level changes over a known time span, the frequency $f_x$ of the test signal can be determined. One way of doing this is to employ a digital filter (for example, a finite impulse response (FIR) decimation filter). The digital filter can be configured to extract a ratio representing the effective sampling rate to the test signal frequency $f_x$, based on the density of logic '1s' appearing at the outputs B1-B8 of the AND logic gates over time. Since the sampling rate $f_s$ is a known value, the frequency $f_x$ of the test signal can then be determined.

The sampling performance of the FDC 200 in FIG. 2A is equivalent to a sampling clock $f_s$ having a period equal to the time between phases of the polyphase clocks $\Phi_1, \Phi_2, \ldots, \Phi_8$. Hence, the FDC 200 is able to sample the test signal at a very high sampling rate, which in this example is effectively $8*f_s$, while the sampling logic itself is clocked at a much lower rate.

Figure 3A:
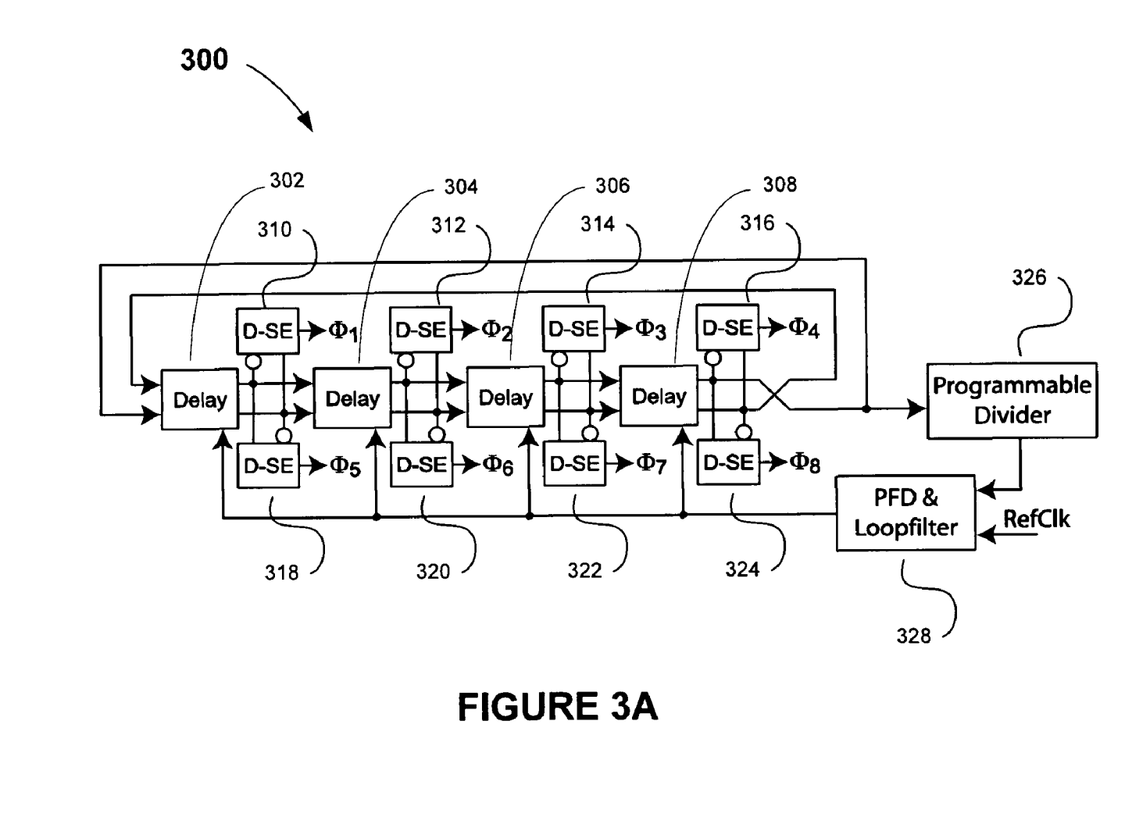
FIG. 3A is a schematic diagram of an exemplary polyphase ring oscillator circuit, which can be use to generate the polyphase clocks $\Phi_1, \Phi_2, \ldots, \Phi_8$ for the polyphase FDC in FIG. 2A.
Figure 3B:
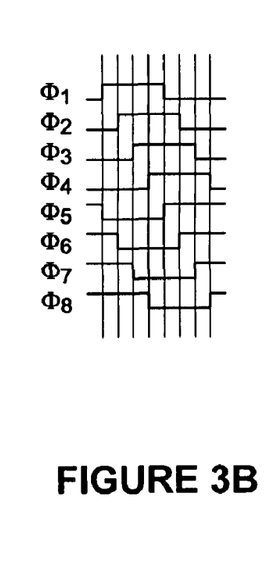
FIG. 3B is a timing diagram showing the timing relationship among the polyphase clocks $\Phi_1, \Phi_2, \ldots, \Phi_8$ generated by the polyphase ring oscillator in FIG. 3A.

There are various ways by which the polyphase clocks $\Phi_1, \Phi_2, \ldots, \Phi_8$ used to clock the FDC 200 can be generated. FIG. 3A shows an exemplary polyphase clock generator 300 which is suitable for this purpose. The polyphase clock generator 300 is implemented in the form of a ring oscillator and comprises four differential delay elements 302-308, eight differential-to-single-ended (D-SE) converters 310-324 for the eight phase endpoints, a programmable divider 326, and a phase-frequency detector (PFD) and loop filter unit 328. The eight phases of the polyphase clock system generated at the outputs of the D-SE converters 310-324 have a timing relationship as shown in FIG. 3B.

The polyphase clock generator 300 is locked to a reference clock ('RefClk' in the drawing), where a variety of ring frequencies can be selected using conventional synthesizer logic. When the plurality of clocks $\Phi_1, \Phi_2, \ldots, \Phi_8$ is used to clock the FDC 200 in FIG. 2A, all levels of the test signal will be sampled at an effective rate that is eight times faster than the rate at which the sampling logic is clocked. There will be no aliasing, so long as eight times the ring clock frequency is greater than two times the test signal frequency $f_x$ (with margin).

Figure 4A:
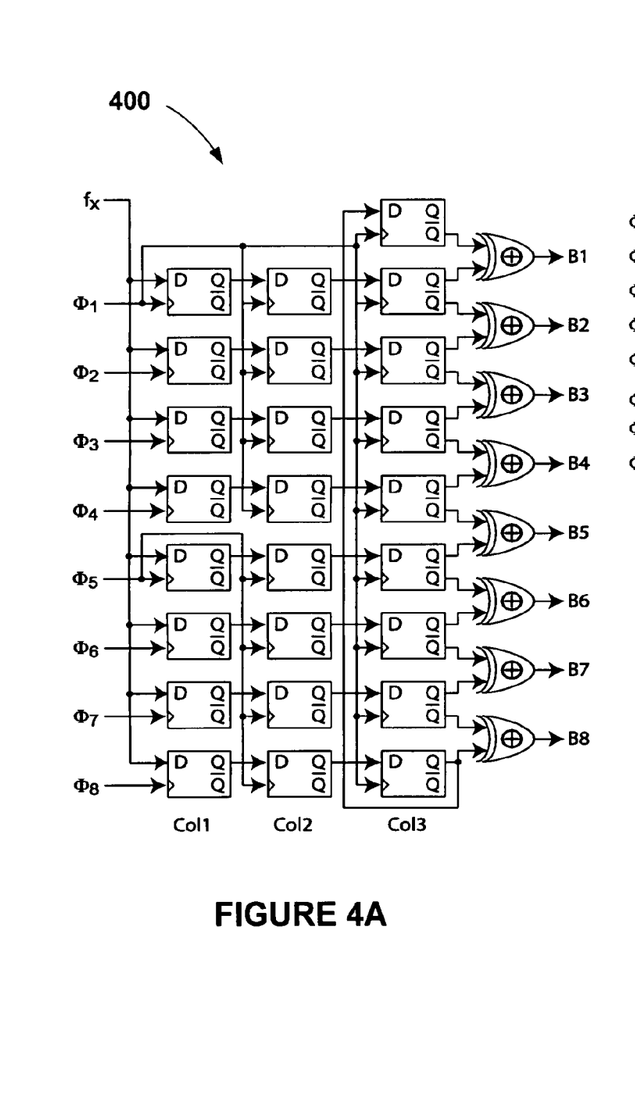
FIG. 4A is a is a schematic diagram of a polyphase FDC, according to an embodiment of the present invention.

The FDC 200 in FIG. 2A employs AND logic gates to determine and indicate the occurrence of low-to-high logic level changes between clock phases. FIG. 4A shows an FDC 400 that is configured to determine and indicate the occurrence of both low-to-high and high-to-low logic level changes between clock phases, according to another embodiment of the present invention. The FDC 400 includes an array of flip-flops configured in rows and columns similar to the FDC 200 in FIG. 2A. However, rather than using AND logic gates to logically combine the data outputs of the flip-flops in the third column of the array, a plurality of exclusive-OR (XOR) logic gates is used to logically combine the outputs. Use of XOR gates provides the ability to determine occurrences of both low-to-high and high-to-low logic level changes between clock phases.

Figure 4B:
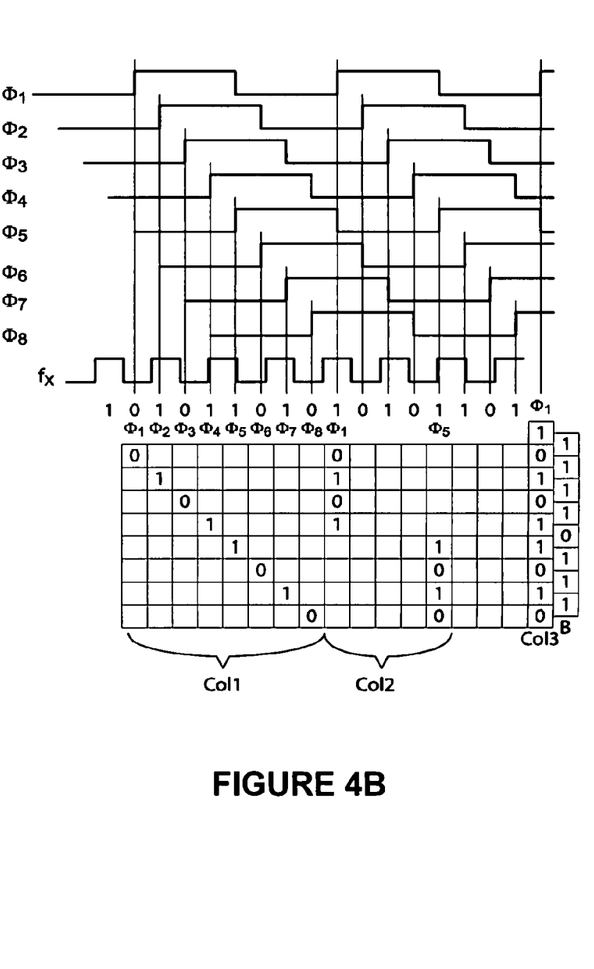
FIG. 4B is a drawing including a timing chart showing the timing relationship among the polyphase clocks $\Phi_1, \Phi_2, \ldots, \Phi_8$ and a test signal applied to the polyphase FDC in FIG. 4A, and an edge detection chart showing edge detection results from sampling the test signal using the polyphase clocks $\Phi_1, \Phi_2, \ldots, \Phi_8$.

FIG. 4B shows a timing diagram and sampling chart for the polyphase FDC 400 in FIG. 4A. As can be seen, the bit pattern generated by the double edge polyphase FDC 400 is more dense in logic '1s' than is the bit pattern generated by the FDC 200 shown in FIG. 2A. This is due to the fact that the FDC 400 in FIG. 4A detects both low-to-high and high-to-low logic level changes between clock, while the FDC 200 in FIG. 2A only detect low-to-high logic level changes.

Figure 5:
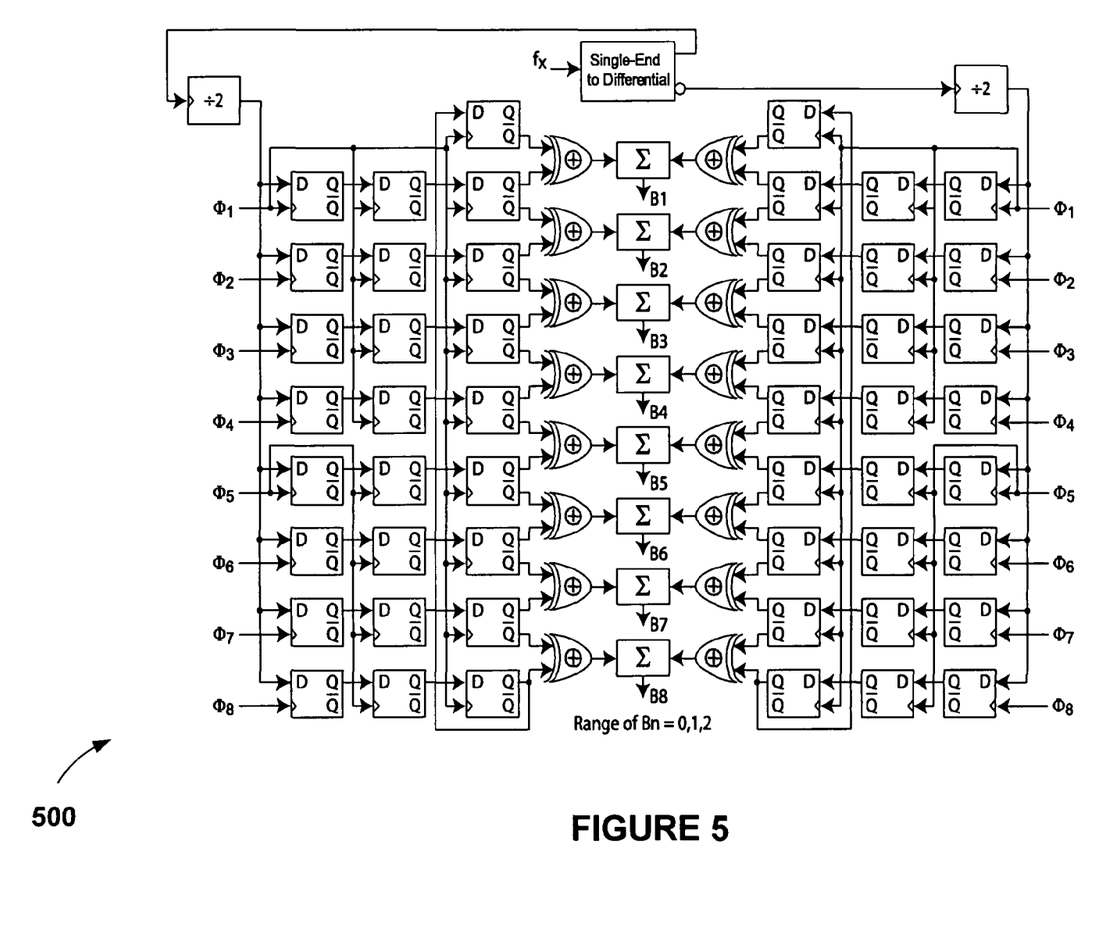
FIG. 5 is a schematic diagram of a dual-bank polyphase FDC, according to an embodiment of the present invention.

FIG. 5 is a drawing of a polyphase frequency to digital converter (FDC) 500, according to another embodiment of the present invention. The FDC 500 comprises a dual-bank FDC, which is adapted to receive a differential test signal having a frequency that is half that of the original test signal frequency $f_x$. Each bank operates similar to the FDC 400 in FIG. 4A. The outputs of the XOR gates are summed by a plurality of summers having outputs B1, B2, . . . , B8. The outputs B1, B2, . . . , B8 can have values of 0, 1, or 2. Similar to the previously described embodiments, the pattern of 0s, 1s and 2s contains information concerning the ratio of the sampling frequency to the test signal frequency. Because the sampling frequency is known, the test signal frequency $f_x$ can be extracted, e.g., by using a digital filter as was explained above.

Generating a divided differential test signal $f_x$, and sampling it with the dual-bank FDC 500, allows better sampling accuracy. Moreover, it affords the ability to either relax the offset among the sampling clock signals $\Phi_1, \Phi_2, \ldots, \Phi_8$ (for the same frequency test signal sampled in the embodiment shown in FIG. 4A) or sample higher frequency test signals without having to reduce the offset among the sampling clock signals $\Phi_1, \Phi_2, \ldots, \Phi_8$.

Figure 6:
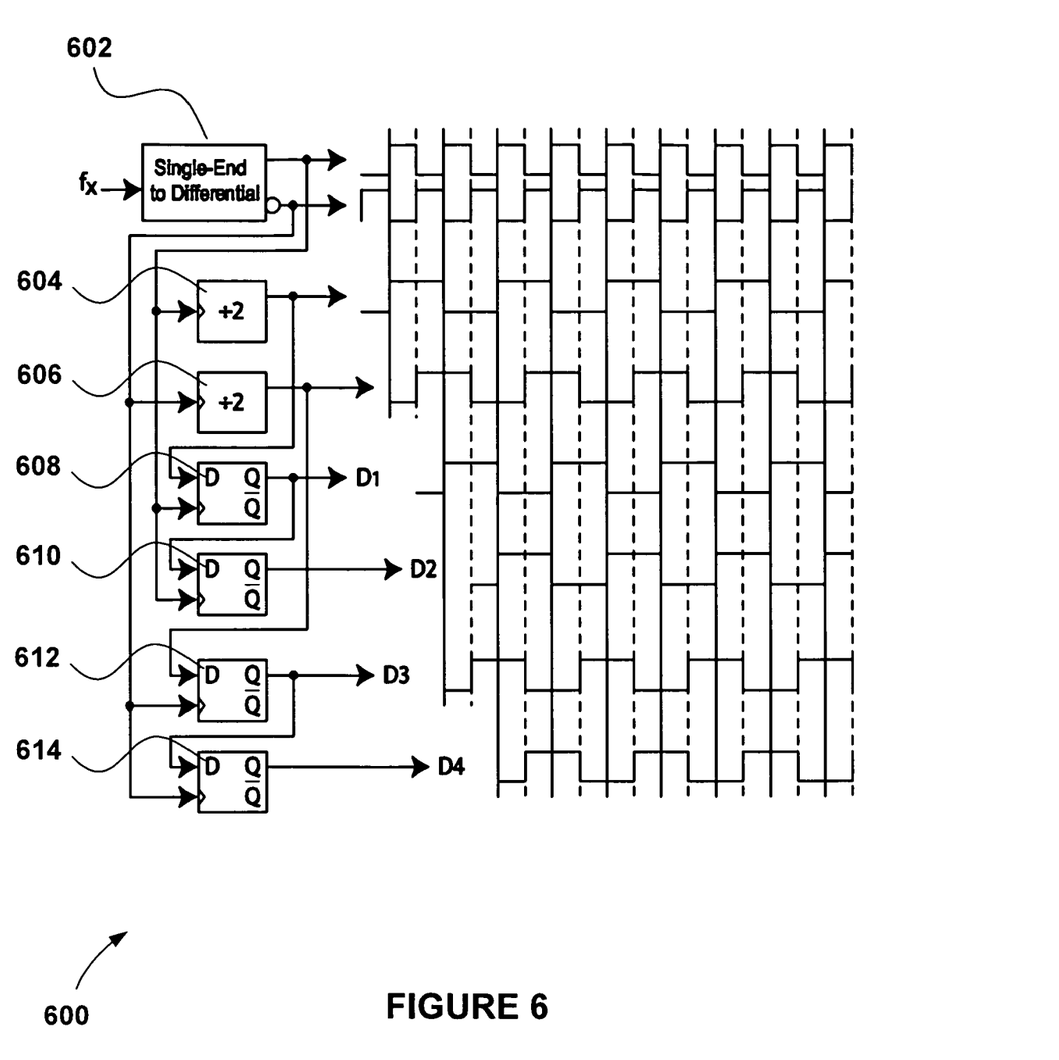
FIG. 6 is a schematic diagram of an edge redistribution circuit, which can be used to simplify the digital sampling of a test signal, in accordance with embodiments of the present invention.

In some applications it may be advantageous to not only divide the test signal frequency but to also redistribute its edges. Redistributing the edges of divided test signals can simplify the sampling process and reduce the amount of clock margin needed to perform the sampling. FIG. 6 is a logic processing circuit 600 that can be used for this purpose. The test signal (again labeled using the signal's frequency label '$f_x$') is passed through a single-end to differential buffer 602, which creates a differential test signal. Each polarity of the differential test signal is separately divided by two by frequency dividers 604 and 606, and then shifted using flip-flops 608-614, thereby providing four redistributed signals. The four redistributed signals preserve the timing of the positive and negative transitions of the test signal $f_x$ and have frequencies that are half of the original test signal frequency $f_x$. Redistributing the edges is non-destructive in the sense that the average density of logic '1s' remains the same. However, the sampling process is simplified because the on and off times of each redistributed signal are fairly symmetric and each redistributed signal can be individually sampled using one of the polyphase FDCs disclosed herein.

Simulations have shown that non-uniform sample periods (i.e., phase offset variations among the clocks making up the polyphase clock system) have very little effect on the accuracy of the conversion, so long as the non-uniformity is periodically synchronous with the filtering used to extract the frequency. Indeed, when a FIR decimation filter is used, conversion remains very accurate so long as the period of the non-uniform pattern is half the period of the symmetric FIR filter span. This property relaxes the required phase tolerances between clocks of the polyphase clock system and, consequently, simplifies the design of the polyphase clock generator and edge redistribution circuits described above.

Figure 7A:
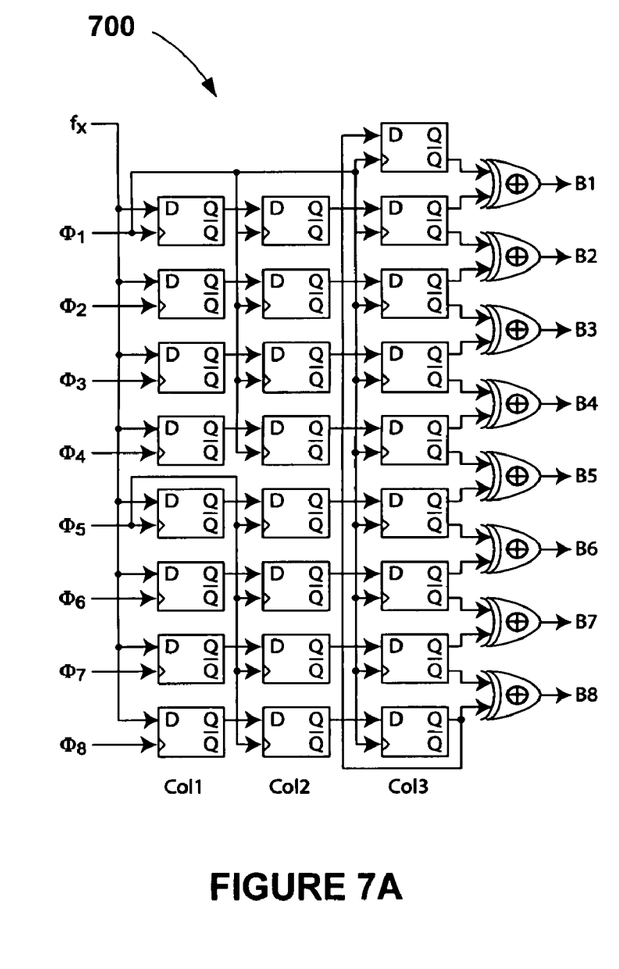
FIG. 7A is a schematic diagram of an asymmetric polyphase FDC, according to an embodiment of the present invention.
Figure 7B:
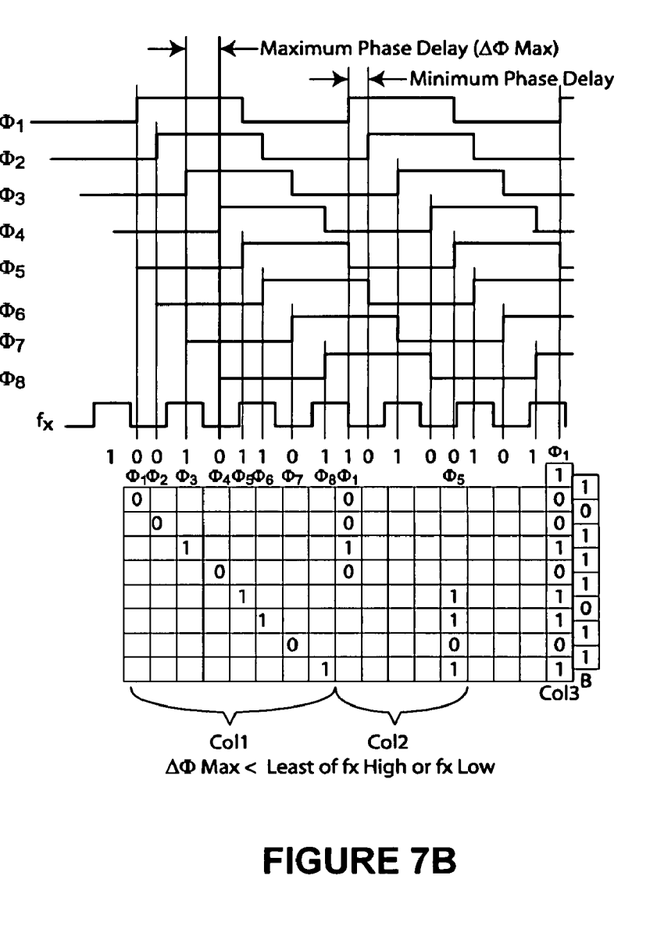
FIG. 7B is a drawing including a timing chart showing the timing relationship among the asymmetric polyphase clocks $\Phi_1, \Phi_2, \ldots, \Phi_8$ and a test signal applied to the asymmetric polyphase FDC in FIG. 7A, and an edge detection chart showing edge detection results from sampling the test signal using the asymmetric polyphase clocks $\Phi_1, \Phi_2, \ldots, \Phi_8$.

FIGS. 7A and B show an example of an 'asymmetric' polyphase FDC 700, which is configured to operate according to a polyphase sampling clock system having non-uniform phases, and associated timing diagram and sampling chart. As can be seen, even with a polyphase clock system having sampling clocks with non-uniform sample periods, the asymmetric polyphase FDC 700 is capable of determining the frequency $f_x$ of a test signal. Operation of the FDC 700 is similar to the previously described embodiments. To prevent aliasing, the time for which the test signal is a '1' or a '0' should be greater than the maximum phase delay $\Delta\Phi$Max among the polyphase clocks.

The asymmetric property of the asymmetric polyphase FDC 700 in FIG. 7 can be exploited to reduce spurious problems that might otherwise develop when the FDC 700 is configured in a radio communications system (such as an RF transmitter or receiver). It can also be used to reduce undesirable side-effects such as tonality, sensitivity to integer clock ratios, and error non-uniformity. For example, any one or more of the delay stages making up the polyphase clock generator (e.g., each stage of the multiphase ring oscillator in FIG. 3A) can be made to be different than any one of the other clocks. Further, these delay stages can be made to be individually programmable, either dynamically or for different test signal frequencies $f_x$.

The previously described embodiments of the present invention employ a polyphase clock system to achieve faster effective sampling rates than can be achieved using prior art FDCs. According to an alternative embodiment of the invention, a higher effective sampling rate is achieved by sampling multiple phases of the test signal. Similar to the above described embodiments, logic level transitions (i.e., logic low-to-high and/or logic high-to-low transitions) are used to determine the frequency of the test signal. However, rather than determining transitions based on logic level samples of the test signal, a plurality of edge detector circuits are used to directly detect edges of multiple phases of the test signal.

Figure 8A:
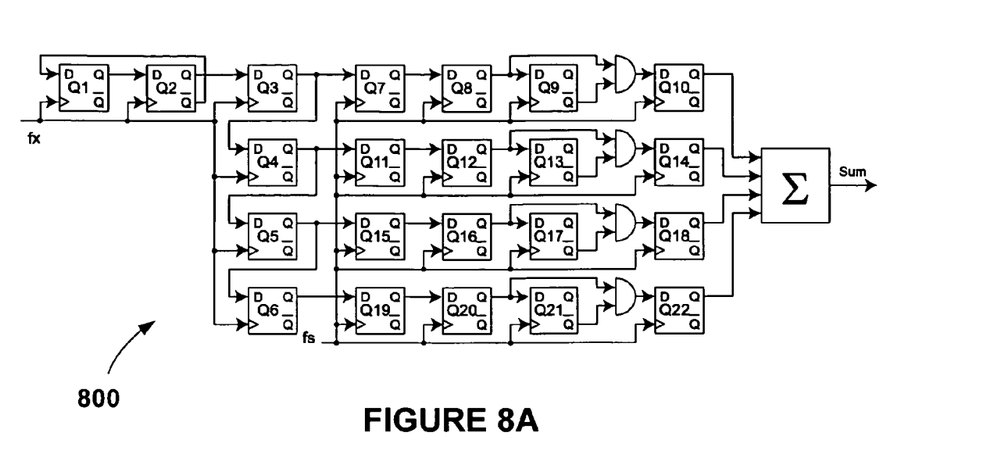
FIG. 8A is a schematic diagram of an FDC that employs a plurality of positive edge detectors to sample multiple phases of a test signal, according to an embodiment of the present invention.
Figure 8B:
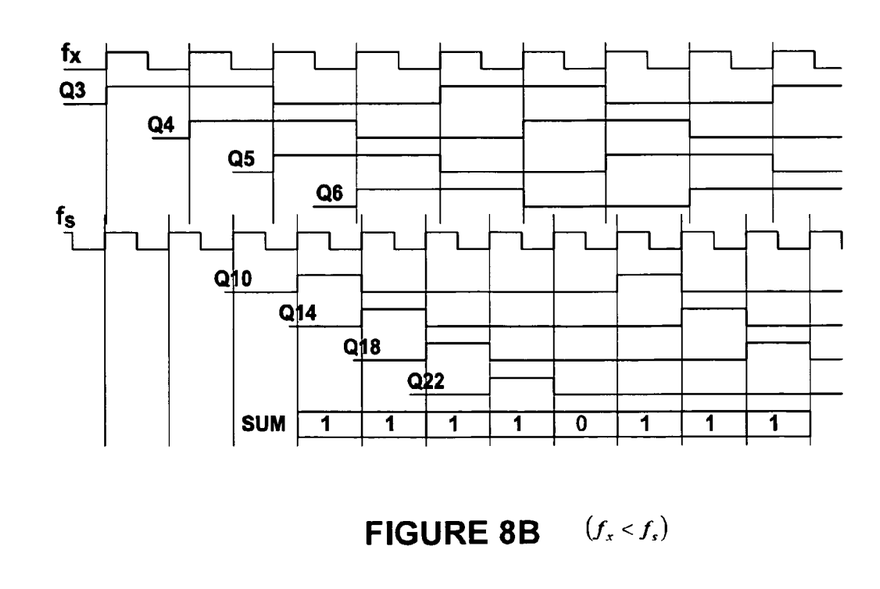
FIG. 8B is a timing diagram showing the timing relationship between a sampling clock and the multiple phases of the test signal of the FDC in FIG. 8A, when the frequency of the test signal is less than the frequency of the sampling clock.

FIG. 8A is a schematic diagram of an FDC 800 employing a plurality of positive edge detector circuits, according to an embodiment of the present invention. Four positive edge detectors are used in this exemplary embodiment. However, any number of asynchronous edge detectors can be used, depending on, for example, design requirements or performance capabilities of available components, as will be appreciated by those of ordinary skill in the art. The four positive edge detectors are configured in four rows. The positive edge detector in the first row comprises D flip-flops Q7-Q10 and an AND gate. Similarly, the positive edge detectors in the second, third and fourth rows, respectively, comprises flip-flops Q11-Q14 and corresponding AND gate; flip-flops Q15-Q18 and corresponding AND gate; and flip-flops Q19-Q22 and corresponding AND gate. Flip-flops Q1 and Q2 divide the test signal $f_x$ by four (4), and flip-flops Q3-Q6 comprise a shift register, which is configured to generate multiple, shifted versions (i.e., multiple phases) of the divided test signal, as indicated by the labels 'Q3,' 'Q4,' 'Q5,' and 'Q6' in the timing diagram in FIG. 8B.

The positive edge detectors in the FDC 800 in FIG. 8A are operable to perform one-shot operations, so that on a rising edge of a divided test signal, an associated positive edge detector provides a logic '1' for one cycle of the sampling clock $f_s$. The results are registered in the four output flip-flops, Q10, Q14, Q18 and Q22, and, for each period of the sampling clock, are summed by an adder. Similar to the previously described embodiments, the density of logic '1s' in the digital stream, relative to the number of logic '0s,' together with knowledge of the sampling clock frequency $f_s$, allows the frequency $f_x$ of the test signal to be determined.

Figure 8C:
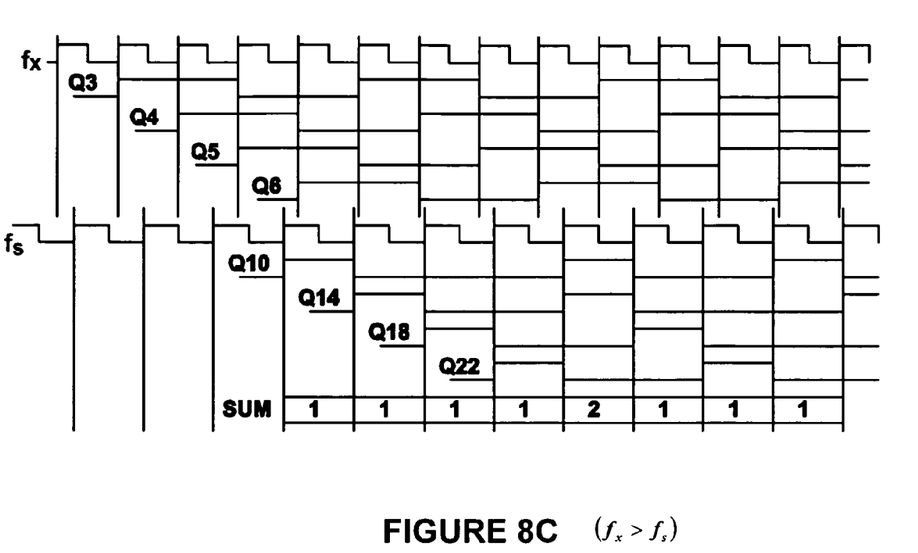
FIG. 8C is a timing diagram showing the timing relationship between a sampling clock and the multiple phases of the test signal of the FDC in FIG. 8A, when the frequency of the test signal is greater than the frequency of the sampling clock.

The FDC 800 in FIG. 8A provides an effective sampling frequency of two times (×2) the sampling frequency $f_s$. It is capable of detecting one or two transitions of the test signal in the period of the sampling clock without aliasing. If $f_x < f_s$, the sum at the output of the FDC 800 will be 0 or 1. If $f_s < f_x < 2f_s$, the sum will be 1 or 2, as shown in FIG. 8C.

Figure 9A:
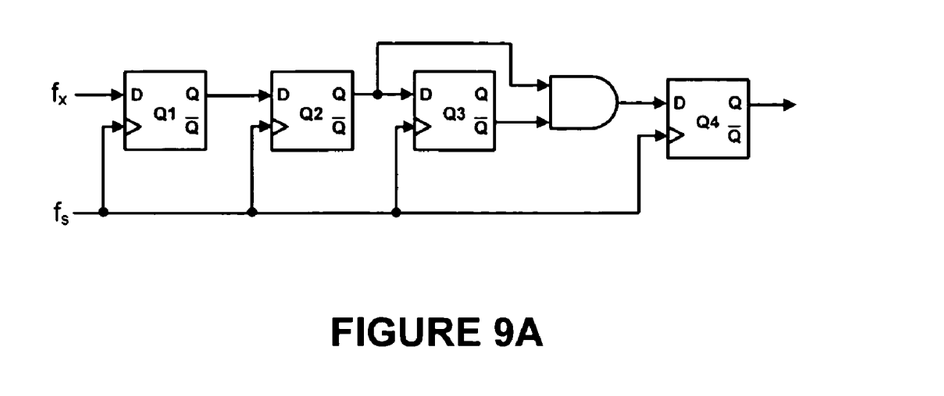
FIG. 9A is a schematic diagram of a negative edge detector, a plurality of which can be used in the FDC shown in FIG. 8A, instead of the plurality of positive edge detectors.
Figure 9B:
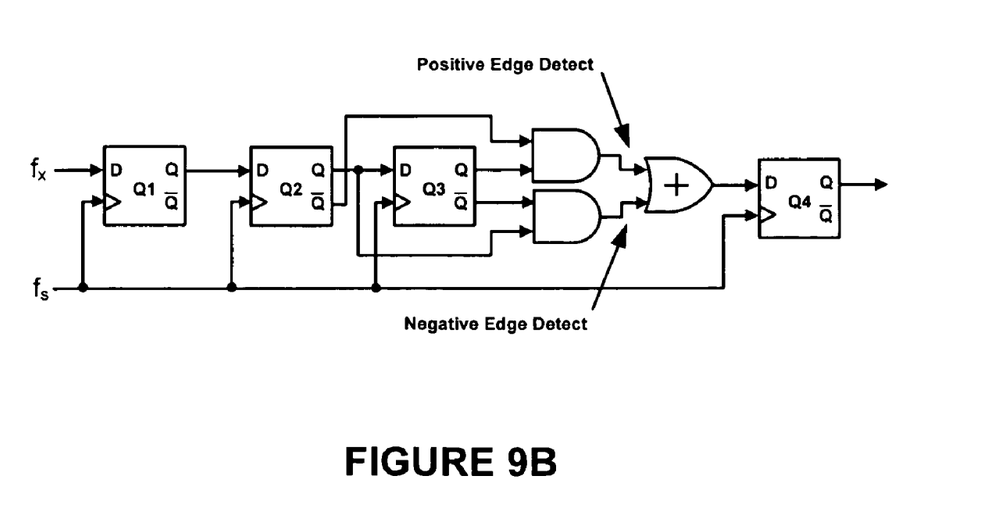
FIG. 9B is schematic diagram of a dual-edge detector, a plurality of which can be used in the FDC shown in FIG. 8A, instead of the plurality of positive edge detectors.

The FDC 800 was shown and described as employing a plurality of positive edge detectors. However, negative and dual-edge (i.e., positive and negative edge) detectors, such as those shown in FIGS. 9A and 9B, respectively, can be alternatively used. Similar to the positive edge detector, the negative and dual-edge detectors each comprises four D flip-flops Q1-Q4 and an AND logic gate. Q1 serves to reduce metastability by re-clocking $f_x$ to be synchronous with $f_s$. Q2 and Q3 perform a digital one-shot operation, so that on a falling (i.e., negative) edge of $f_x$ the output of the AND gate of the negative edge detector (FIG. 9A) will be a logic '1' for one cycle of the sampling clock $f_s$. The dual-edge detector in FIG. 9B operates similarly, except that a digital one-shot is generated for one cycle of the sampling clock $f_s$ each time a falling or rising edge of $f_x$ is detected.

Figure 10:
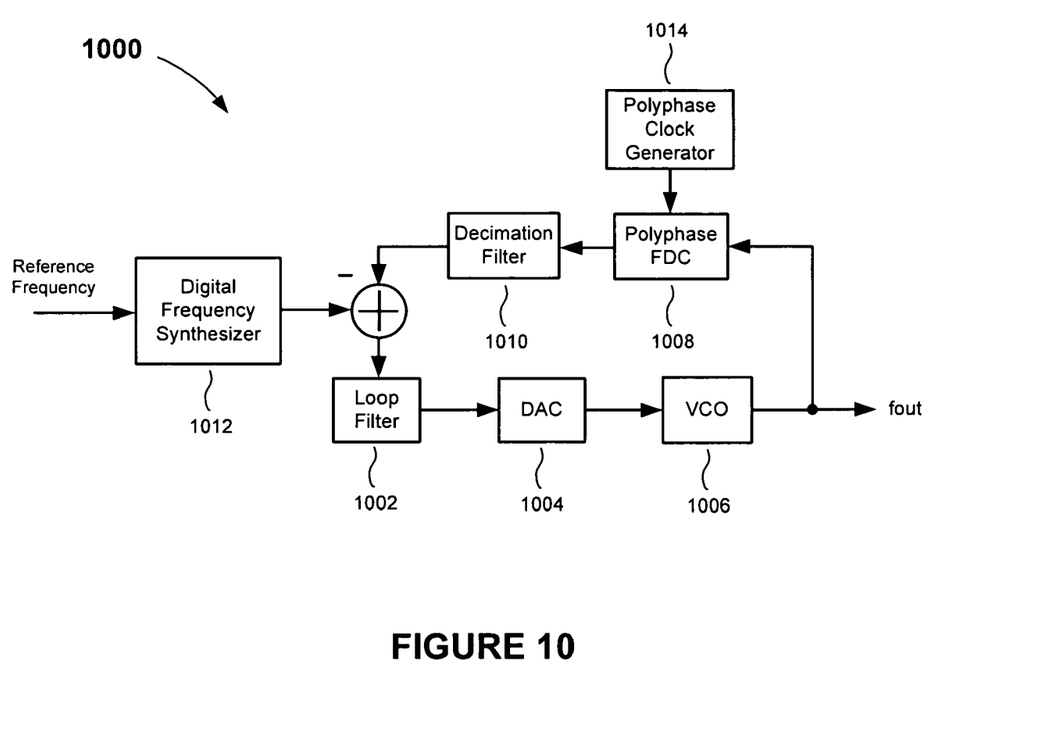
FIG. 10 is block diagram of a frequency-locked loop (FLL) that employs a polyphase FDC, according to an embodiment of the present invention.

The FDCs of the present invention may be used in a variety of applications. FIG. 10 illustrates, for example, how one of the polyphase FDCs described above can be used in a frequency-locked loop (FLL) 1000. The FLL 1000 includes a main signal path and a feedback path. The main signal path includes a loop filter 1002, a digital-to-analog converter (DAC) (e.g., sigma-delta DAC) 1004, and a voltage controlled oscillator (VCO) 1006. The feedback path contains a polyphase FDC 1008 and a decimation filter 1010.

The FLL 1000 operates to force the frequency of the signal at the output of the VCO 1006 toward a reference frequency. The reference frequency is digitally represented by a first digital stream generated by a digital frequency synthesizer (DFS) 1012, similar to the digital portion of a sigma-delta analog to digital converter. In the main path of the FLL 1000, the loop filter 1002 filters out noise from the error signal and provides the filtered error signal to the DAC 1004. The DAC 1004 converts the digital error signal to an analog error signal, which is applied to the VCO 1006. The VCO 1006 changes its output frequency based on the value of the analog error signal.

In the feedback path, the polyphase FDC 1008 samples the VCO output signal, similar to described above, using a polyphase clock system provided by a polyphase clock generator 1014. A second digital stream generated by the polyphase FDC 1008 is decimated down to the clock rate of the main path and subtracted from the first digital stream representing the desired frequency (i.e., the reference frequency) to generate the error signal. The VCO 1006 responds to changes in the error signal by changing its output frequency. This feedback operation is performed continuously to force the VCO output frequency to equal the reference frequency.

Figure 11:
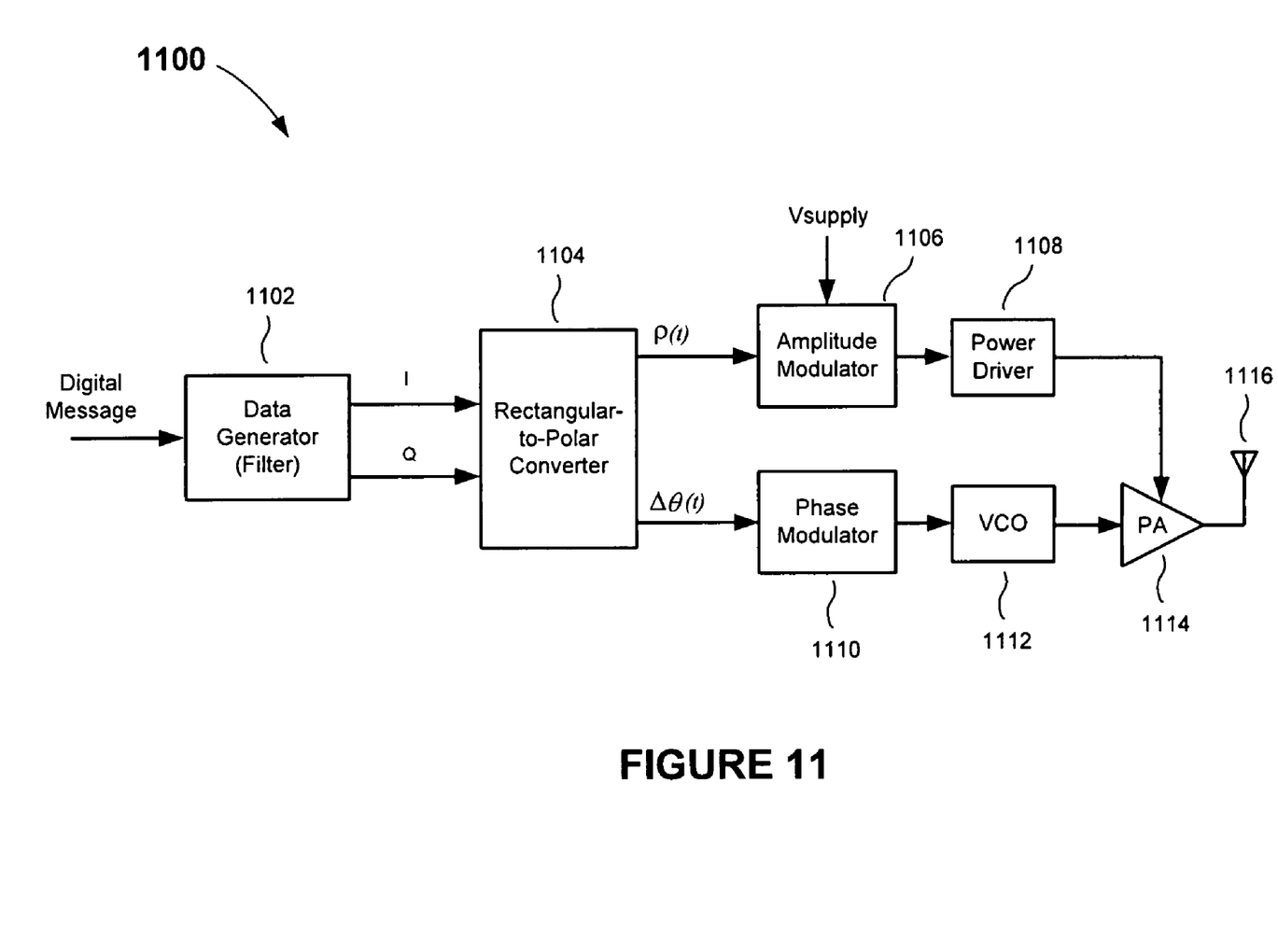
FIG. 11 is a block diagram of a polar modulation transmitter.

According to an embodiment of the present invention, the FLL 1000 in FIG. 10 is adapted for use in the phase path of a polar modulation transmitter. As shown in FIG. 11, a polar modulation transmitter 1100 modulator comprises a data generator 1102; a rectangular-to-polar converter 1104; an amplitude modulator 1106 and a power driver 1108 configured within an amplitude path of the transmitter 1100; a phase modulator 1110 and a voltage controlled oscillator (VCO) 1112 configured within a phase path of the transmitter 1100; a power amplifier (PA) 1114; and an antenna 1116.

An incoming digital message is coupled to the data generator 1102 to generate in-phase (I) and quadrature phase (Q) pulse-shaped baseband signals. The rectangular-to-polar converter 1104 converts the I and Q baseband signals into a polar signal comprised of an envelope (i.e., amplitude) signal component ρ(t) and a constant-amplitude phase difference signal component Δθ(t). The amplitude modulator 1106 is configured to receive the envelope signal ρ(t) in the amplitude path, and modulate a power supply voltage (Vsupply) according to the amplitude of envelope signal ρ(t). At the same time, the phase modulator 1110 receives the constant-amplitude phase difference signal Δθ(t) in the phase path, and drives the VCO 1112 to provide an RF drive signal to the PA 1114.

Figure 12:
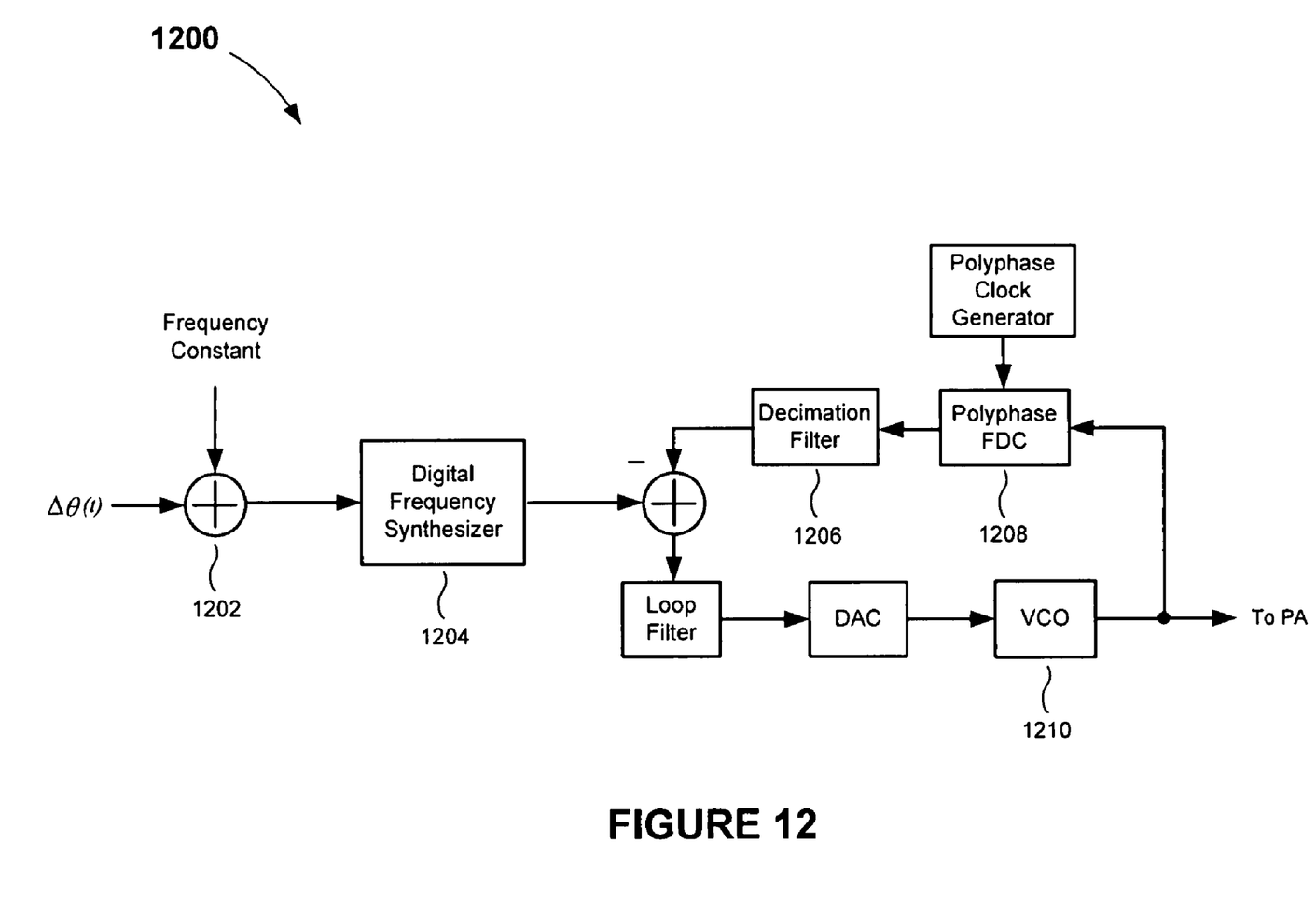
FIG. 12 is a block diagram of the FLL in FIG. 10 adapted for use in the phase path of the polar modulation transmitter in FIG. 11, according to an embodiment of the present invention.

FIG. 12 illustrates how the FLL 1000 in FIG. 10 is adapted for use in the phase path of the polar modulation transmitter 1100 in FIG. 11. The desired output frequency is derived from two sources represented in digital form. The first source is a frequency constant, which represents the center frequency of the VCO for a particular channel, for example. The second is the phase difference signal Δθ(t) in the phase path of the transmitter 1100. The phase difference signal Δθ(t) includes the sample time by sample time change in the desired phase of the modulated signal. These two digital signals are summed by a summer 1202. The sum is presented to a DFS 1204, which generates a digital reference frequency (i.e., a desired output frequency). Similar to explained above, a decimation filter 1206 in the feedback path of the FLL 1200 decimates the digital stream generated by the polyphase FDC 1208 down to the clock rate of the main path. The decimated digital signal is then subtracted from the digital reference frequency to generate an error signal. The VCO 1210 responds to changes in the error signal by changing its output frequency. This feedback operation is performed continuously to force the VCO output frequency to equal the frequency represented by the digital reference frequency.

While the above is a complete description of the preferred embodiments of the invention sufficiently detailed to enable those skilled in the art to build and implement the system, it should be understood that various changes, substitutions, and alterations may be made without departing from the spirit and scope of the invention as defined by the appended claims.

What is claimed is:

1. A polyphase sampling apparatus, comprising:
   a plurality of sampling circuits configured to sample a periodic digital signal according to a polyphase clock system having multiple phases; and
   a plurality of logic level change circuits coupled to said plurality of sampling circuits operable to detect logic level changes of the periodic digital signal that occur between phases of said polyphase clock system,
   wherein a periodic phase difference between a first pair of consecutive phases of the polyphase clock system is different from a periodic phase difference between a second pair of consecutive phases and wherein the time for which a test signal is a '1' or a '0' is greater than the maximum phase delay ΔΦMax among the polyphase clocks,
   wherein the periodic digital signal is sampled at a rate equal to the inverse of the phase difference between the consecutive sampling clock signals and successively sampling the periodic digital signal is performed using logic circuitry that is clocked at a rate that is less than the rate at which the periodic digital signal is sampled.

2. The polyphase sampling apparatus of claim 1 wherein said plurality of sampling circuits comprises a plurality of flip-flops.

3. The polyphase sampling apparatus of claim 1 wherein each of the sampling circuits is clocked at rate that is less than the rate at which the periodic digital signal is sampled.

4. The polyphase sampling apparatus of claim 1 wherein the multiple phases of the polyphase clock system are successively distributed in time so that consecutive phases have a periodic phase difference.

5. The polyphase sampling apparatus of claim 1 wherein the logic level changes of the periodic digital signal detected by the plurality of logic level change circuits are used to determine the frequency of the periodic digital signal.

6. A method of sampling a periodic digital signal, comprising:
   receiving a periodic digital signal; and
   successively sampling the periodic digital signal using a plurality of sampling clock signals,
   wherein the sampling clock signals of said plurality of sampling clock signals have the same frequency and are successively distributed in time so that consecutive sampling clock signals have a periodic phase difference,
   wherein the periodic phase difference between a first pair of consecutive sampling clock signals of the plurality of clock signals is different from a periodic phase difference between a second pair of consecutive sampling clock signals and wherein the time for which a test signal is a '1' or '0' is greater than the maximum phase delay ΔΦMax among the polyphase clocks,
   wherein the periodic digital signal is sampled at a rate equal to the inverse of the phase difference between the consecutive sampling clock signals, and successively sampling the periodic digital signal is performed using logic circuitry that is clocked at a rate that is less than the rate at which the periodic digital signal is sampled.

7. The method of claim 6, further comprising detecting logic level changes between successive samples of the periodic digital signal.

8. The method of claim 7, further comprising using the detected logic level changes to determine the frequency of the periodic digital signal.

9. The method of claim 8 wherein using the detected level changes to determine the frequency of the periodic digital signal comprises logically combining successive samples of the periodic digital signal.

10. A method of determining the frequency of a periodic digital signal, comprising:
    sampling the periodic digital signal using a polyphase clock system; and
    using samples generated by said sampling to determine the frequency of the periodic digital signal,
    wherein a periodic phase difference between a first pair of consecutive phases is different from a periodic phase difference between a second pair of consecutive phases and wherein the time for which a test signal is a '1' or '0' is greater than the maximum phase delay ΔΦMax among the polyphase clocks,
    wherein the periodic digital signal is sampled at a rate equal to the inverse of the phase difference between the consecutive sampling clock signals and successively sampling the periodic digital signal is performed using logic circuitry that is clocked at a rate that is less than the rate at which the periodic digital signal is sampled.

11. The method of claim 10 wherein the polyphase clock system comprises multiple phases successively distributed in time with a periodic phase difference between consecutive phases.

12. The method of claim 11 wherein one or more of the periodic phase differences between consecutive phases is programmable.

* * * * *